United States Patent
Artman et al.

(10) Patent No.: US 9,494,954 B2
(45) Date of Patent: Nov. 15, 2016

(54) THERMAL CONTROL SYSTEMS AND METHODS FOR INFORMATION HANDLING SYSTEMS

(75) Inventors: Paul Artman, Austin, TX (US); Hasnain Shabbir, Round Rock, TX (US)

(73) Assignee: Dell Products LP, Round Rock, TX (US)

( * ) Notice: Subject to any disclaimer, the term of this patent is extended or adjusted under 35 U.S.C. 154(b) by 981 days.

(21) Appl. No.: 13/559,031

(22) Filed: Jul. 26, 2012

(65) Prior Publication Data

US 2014/0032011 A1 Jan. 30, 2014

(51) Int. Cl.
*G05D 23/19* (2006.01)
*G06F 1/20* (2006.01)
*G06F 1/32* (2006.01)

(52) U.S. Cl.
CPC ...... *G05D 23/1931* (2013.01); *G05D 23/1928* (2013.01); *G05D 23/1932* (2013.01); *G05D 23/1934* (2013.01); *G06F 1/206* (2013.01); *G06F 1/3206* (2013.01)

(58) Field of Classification Search
CPC ........... G05D 23/1928; G05D 23/193; G05D 23/1931; G05D 23/1932; G05D 23/1934; G06F 1/203; G06F 1/206; G06F 1/3206
USPC ................................. 700/299, 300
See application file for complete search history.

(56) References Cited

U.S. PATENT DOCUMENTS

| | | | |
|---|---|---|---|
| 4,300,037 A | 11/1981 | Padden | |
| 4,949,578 A | 8/1990 | Harpster | |
| 5,926,386 A | 7/1999 | Ott et al. | |
| 6,340,874 B1 * | 1/2002 | Vladimir | 318/471 |
| 7,130,719 B2 | 10/2006 | Ehlers et al. | |

(Continued)

OTHER PUBLICATIONS

Pereira, "Information Handling System Storage Device Management Information Access", U.S. Appl. No. 13/285,844, filed Oct. 31, 2011, 15 pgs.

(Continued)

*Primary Examiner* — Robert Fennema
*Assistant Examiner* — Jennifer L Norton
(74) *Attorney, Agent, or Firm* — Egan Peterman Enders Huston

(57) ABSTRACT

Systems and methods are provided for information handling system thermal control that employ configuration-based temperature feedback, e.g., by using configuration-based fan speed control based on real time individual measured component temperatures. In one example, the disclosed systems and methods may be implemented to allow inputs from one or more hardware temperature sensors to set cooling fan speeds and/or power capping levels in a closed loop fashion, rather than relying solely (or at all) on system inlet ambient temperature.

6 Claims, 6 Drawing Sheets

(56) References Cited

U.S. PATENT DOCUMENTS

| | | | |
|---|---|---|---|
| 7,310,737 B2* | 12/2007 | Patel et al. | 713/300 |
| 7,394,217 B2 | 7/2008 | Marando | |
| 7,987,024 B2 | 7/2011 | Tunks et al. | |
| 8,280,559 B2 | 10/2012 | Herman et al. | |
| 8,467,912 B2 | 6/2013 | Zwinger et al. | |
| 8,560,126 B2 | 10/2013 | Vass et al. | |
| 8,700,217 B2* | 4/2014 | Lee | 700/276 |
| 8,718,835 B2 | 5/2014 | Sankar et al. | |
| 2003/0011984 A1* | 1/2003 | Chu et al. | 361/687 |
| 2004/0264124 A1* | 12/2004 | Patel et al. | 361/686 |
| 2005/0006085 A1* | 1/2005 | Nelson | 165/299 |
| 2009/0099696 A1* | 4/2009 | Artman et al. | 700/276 |
| 2010/0087965 A1* | 4/2010 | Tunks et al. | 700/300 |
| 2010/0205469 A1* | 8/2010 | McCarthy | G06F 9/5061 713/324 |
| 2011/0176275 A1* | 7/2011 | Sato | 361/695 |
| 2012/0016533 A1* | 1/2012 | Lim et al. | 700/300 |
| 2012/0218707 A1* | 8/2012 | Chan | 361/679.48 |
| 2013/0101389 A1* | 4/2013 | Chou et al. | 415/1 |
| 2013/0318371 A1* | 11/2013 | Hormuth | G06F 1/28 713/320 |

OTHER PUBLICATIONS

Dell, Press Release, Dell Unleashes The World's Most Powerful 15.6 Inch Mobile Workstation, Mar. 9, 2010, 2 pgs.

Dell, Press Release, Dell Unveils Next Generation Precision M4500 Mobile Workstation, Mar. 9, 2010, 3 pgs.

Long et al., "A Framework For Optimizing Thermoelectric Active Cooling Systems", ACM, 2010, 5 pgs.

Rempel et al., "Optimization Of Passive Cooling Control Thresholds With GenOpt And EnergyPlus", ACM, 2015, 8 pgs.

Hatano et al., "A Cooling And Heat-Retention System Actuated By Peltier Device Considering Fan-motor Control", IEEE, 2014, 6 pgs.

Folcarelli et al., "An Opportunistic Reconfiguration Strategy For Environmentally Powered Devices", ACM, 2006, 6 pgs.

* cited by examiner

THERMAL CONTROL SYSTEMS AND METHODS FOR INFORMATION HANDLING SYSTEMS

FIELD OF THE INVENTION

This invention relates generally to information handling systems and, more particularly, to thermal control for information handling systems.

BACKGROUND OF THE INVENTION

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

One or more cooling fans are typically employed within the chassis of information handling systems, such as servers, to cool components operating within the information handling system chassis. Such cooling fans may be uncontrolled, i.e., running at full power whenever the information handling system is a powered on state. However, cooling fans consume power, create noise, and create airflow, each of which becomes of greater concern in a data center where a plurality of information handling systems may be operating, e.g., as servers. Cooling fans may also be controlled based on ambient temperature within an information handling system chassis.

Thermal control techniques have been developed for information handling systems in an attempt to reduce power consumption, airflow and acoustic noise generated by cooling fans. Such techniques include proportional-integral-derivative (PID) control loop feedback. There has also been a push to increase the number and type of components mapped into thermal control for a given information handling system. In particular, there has been a desire to include hard disk drive (HDD) and redundant array of independent disks (RAID) hardware (RAID card) temperature information for thermal control due to the manner in which these components drive open loop fan requirements for shipped information handling systems, such as servers. By implementing thermal control using temperature information from such additional components, fan speeds can be reduced for normal operation while at the same time allowing improved coverage on high stress conditions.

Direct mapping of cooling fan speeds to HDD and RAID hardware temperatures has proven problematic for several reasons. First, updating temperatures from such hardware components at the rate that is typically used for PID thermal control (1 to 5 seconds) has pronounced adverse performance impacts on HDD throughput and latency. Moreover, relatively slow component response times (in the order of minutes) causes concerns when using PID control due to interaction with memory and central processing unit (CPU) PID input which is typically on the order of seconds.

Thermal control techniques have been implemented for RAID servers that control cooling fan speeds based on HDD and battery temperature response. The scoped temperature response time for such HDD and battery hardware components is once every 5 seconds. However due to performance impacts on the hardware RAID card of the server, the temperature response time is set at 1 minute for battery hardware and 5 minutes for HDD components. Thus temperature updates are slower than the response time of the components to a transient load change (See FIGS. 1 and 2) which makes mapping fan speed response to component temperature changes difficult. Moreover thermal response of different components may vary differently over time with changes in load, as illustrated in FIG. 2 for the battery and controller components of a RAID card, which makes thermal control of such components together difficult. The combination of component thermal mass and temperature polling rates causes disconnect in thermal control response to temperature inputs that needs to be addressed.

Hardware components with fast temperature response times (1-5 seconds) have been mapped directly into cooling fan thermal control using traditional closed loop control with either PID or guard band approaches. However, when temperature response times are slower (10-300 seconds) closed loop approaches can cause fan speeds to quickly go to full speed. Conventional closed loop response looks for a temperature change once every second and in absence of temperature update speeds up of the fans at a minimum of 1% PWM per second. When such conventional closed loop control does not receive HDD and battery temperature updates for periods of time greater than 60 seconds, closed loop thermal control quickly drives fans to full speed with corresponding acoustic and fan power impacts. This can be mitigated to some degree by changing the fan speed response time to be closer to the closed loop response time of the component. However, in this case the closed loop response time is not fast enough for PID to respond adequately with fan speed overshoot causing oscillation in fan speeds.

Open loop power capping techniques have been employed for an information handling system based on measured system inlet ambient temperature. Such techniques initiate power capping of system components based on temperature when measured inlet ambient temperature meets or exceeds a maximum inlet ambient temperature threshold, but do not initiate power capping based on temperature as long as measured inlet ambient temperature remains below the maximum inlet ambient temperature threshold. As a result, higher fan speeds and/or power capping may be implemented even when individual hardware components do not actually need additional cooling.

SUMMARY OF THE INVENTION

Disclosed herein are systems and methods for information handling system thermal control that employ configuration-based temperature feedback, e.g., by using configuration-based fan speed control based on real time individual measured component temperatures (e.g., such as HDDs or battery pack components). The disclosed systems and methods may be implemented in one embodiment to allow inputs from one or more hardware temperature sensors to set cooling fan speeds and/or power capping levels in a closed loop fashion, rather than relying solely (or at all) on system inlet ambient temperature. Thus, in one embodiment, this closed loop approach allows cooling fan speed response and/or power capping operations to be only initiated when the measured temperature of one or more respective system hardware components gets meets or exceeds a predefined minimum temperature threshold (or trigger point temperature of concern). This is in contrast to setting cooling fan speeds using an open loop methodology that is based solely on a minimum inlet ambient temperature threshold (e.g., chassis air inlet temperature) which assumes component maximum loading at all times regardless of actual component loading and resulting component temperature. In the latter open loop case, even when there is little or no actual hardware component stress load, cooling fans will always be running at higher cooling speeds when the minimum inlet ambient temperature threshold is met or exceeded.

The closed loop control of the disclosed systems and methods may be advantageously implemented in a configuration-based manner. For example, in one embodiment, measured hardware component temperatures may be used directly for determining cooling fan speeds based on one or more different fan speed control functions, e.g., such as a fifth order polynomial (e.g., such as of the form $a*T^5+b*T^4+c*T^3+d*T^2+e*B+f$), an exponential curve (e.g., such as of the form $a*e^{bT}$), or other functional relationship in which T is measured component temperature, and a, b, c, d, e and f are constants. Examples of such functional relationships include, but are not limited to, those having temperature-based non-linear thermal control response curves that have multiple shapes and/or slopes. In such an embodiment, functional relationships may be used to define cooling fan speed response based on real time measured hardware component temperature/s. In one embodiment, temperature ranges may be specified or otherwise defined for individual system components, and closed loop thermal control implemented to control system operation to substantially maintain each component temperature at its corresponding defined temperature range.

In one embodiment, a discrete hardware component temperature (T) may be measured in real time and input into a fan speed control function that is expressed as a curve or linear relationship, or other suitable functional relationship that defines cooling fan speed in a manner such that any measured increase in hardware component temperature over several minutes (e.g., less than about 2 minutes) will not cause cooling fan speed to transition to maximum speed in the same situation where full speed cooling fan operation would result using conventional (non-configuration based) closed loop thermal control. By so using this embodiment, good stability may be provided by the defined fan speeds of the functional relationship whereas conventional closed loop response (especially for multiple components in parallel) may cause instability. Moreover, the disclosed systems and methods may be so implemented in one embodiment to control system noise so that noise generated by the system (e.g., such as server tower) and its cooling fans remains within maximum allowable acoustic levels.

The disclosed systems and methods may also be implemented in one embodiment in a manner such that any calculated negative fan speed is ignored by the thermal control. In this regard, negative calculated fan speeds may occur, for example, in a situation where component temperatures are substantially below target temperature ranges. However, in contrast to conventional systems the disclosed systems and methods may be implemented with thermal control in a manner that ignores any calculated negative fan speed in order to allow finer tuning of cooling fan speed response so that it is limited to just a defined temperature range of concern (e.g., from about 50° C. to about 60° C. or other defined range or ranges). In such an embodiment, cooling fans response may be turned off or deactivated when a negative cooing fan speed is indicated by thermal control input based on the measured real time temperature of one or more components (e.g., such as a HDD, battery pack or other component/s), unless measured temperatures of one or more other components of the information handling system indicate a temperature/s that dictates a positive cooling fan speed. Negative fan speed response would cause fan speeds to be set below the minimum requirements set by both open loop ambient and closed loop component temperature input into the thermal control.

In another embodiment, configuration-based thermal control may be combined with closed loop thermal control to achieve a dampened fan speed response under most measured component temperature conditions that are below a predefined maximum allowable temperature for the component/s, but with the ability to target and address a maximum measured component temperature when it occurs. By dampened fan speed response it is meant that the fan speed response is controlled and does not respond in a large stepped response. In such an embodiment, configuration based fan speed relationships may be used to respond to component temperature response under most supported configurations, loading, and ambient temperatures with dampened and predictable fan speed response in order to ensure fan speeds that change according to one or more measured component temperature changes at a moderate rate that substantially aligns with the thermal response times of the components while measured component temperatures are below the maximum temperature values predefined for the corresponding component/s. However, upon detection of one or more defined maximum allowable component temperature/s, closed-loop temperature control may be implemented to ensure that absolute maximum temperature requirements are met. In this way, cooling fan speed changes dictated by closed loop thermal control will be much less dramatic at this point, since configuration-based thermal control will already have driven moderate changes (e.g., increases) to system fan speeds.

In another embodiment, systems and methods may be provided that use the disclosed configuration-based thermal control to implement power capping for an information handling system based on one or more individual component temperatures, rather than just based on system inlet ambient temperature. This embodiment may be so implemented in a closed loop manner to allow power capping only when one or more designated hardware components reach respective predefined temperature limits, rather than using an open loop system inlet ambient based approach which initiates power capping when measured inlet ambient temperature meets or exceeds a minimum inlet ambient temperature threshold and which can result in power capping operation where it may not be needed or desired.

In one respect, disclosed herein is an information handling system, including: an enclosure; one or more heat generating hardware components contained within the enclosure; and thermal management circuitry comprising at least one processing device coupled to non-volatile memory. The non-volatile memory may include thermal configuration information stored thereon, and the processing device may be configured to access the stored thermal configuration information and to control at least one of cooling or power capping for the one or more heat generating hardware components based on the accessed stored thermal configuration information in combination with feedback of the sensed temperature of at least one of the hardware components. The thermal configuration information may include a defined functional relationship between at least one of cooling fan speed level or power capping level and the sensed temperature of the at least one hardware component that is fedback to the processing device.

In another respect, disclosed herein is a method for managing thermal control for an information handling system. The method may include providing an information handling system comprising: an enclosure, one or more heat generating hardware components contained within the enclosure, and thermal management circuitry comprising at least one processing device coupled to non-volatile memory, the non-volatile memory including thermal configuration information stored thereon. The method may further include: sensing the temperature of at least one of the hardware components; feeding the sense temperature of the at least one of the hardware components back to the at least one processing device; and using the at least one processing device to access the stored thermal configuration information to control at least one of cooling or power capping for the one or more heat generating hardware components based on the accessed stored thermal configuration information in combination with the sensed temperature of the at least one of the hardware components. The thermal configuration information may include a defined functional relationship between at least one of cooling fan speed level or power capping level and the sensed temperature of the at least one hardware component feedback to the processing device.

DESCRIPTION OF ILLUSTRATIVE EMBODIMENTS

Figure 1:
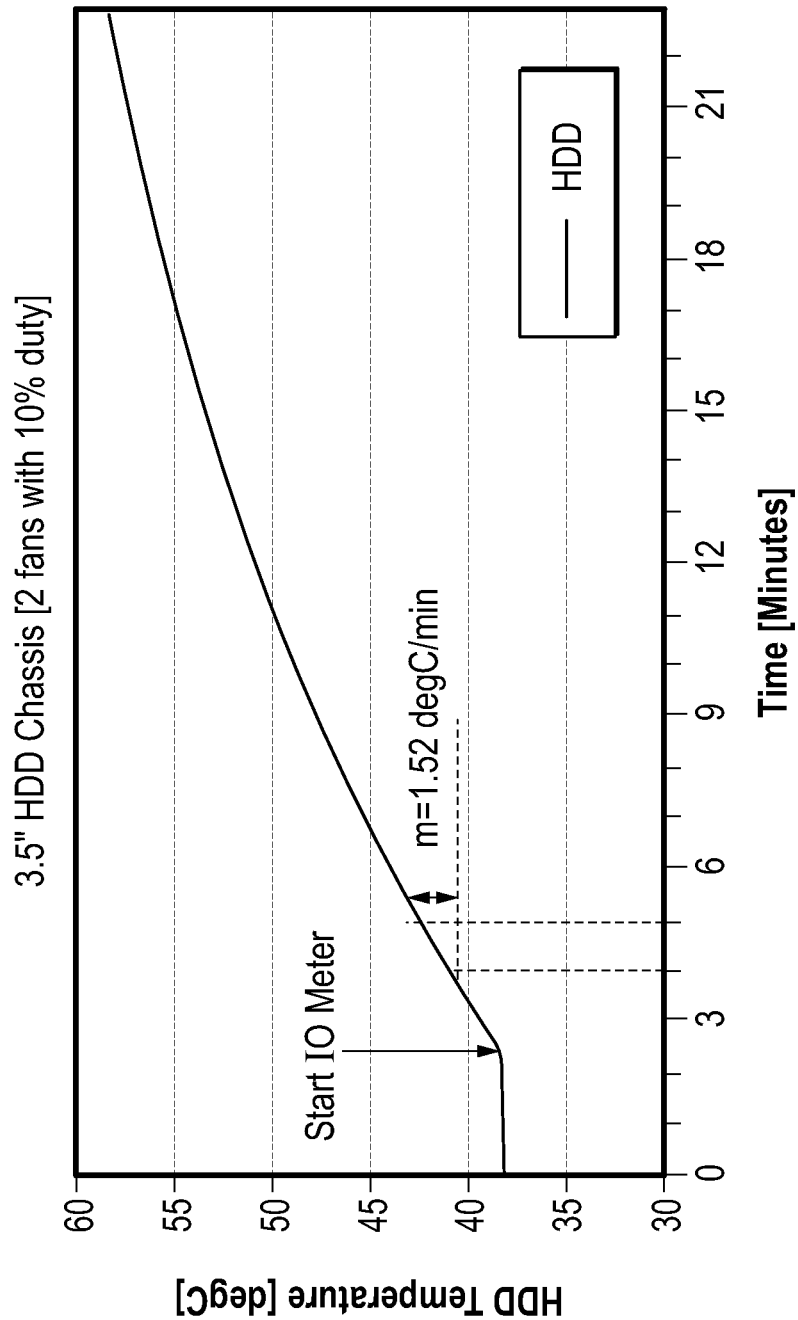
FIG. 1 illustrates temperature increase of a hard disk drive (HDD) under constant load versus time for a 3.5" information handling system having two cooling fans operating at a constant 10% duty.
Figure 2:
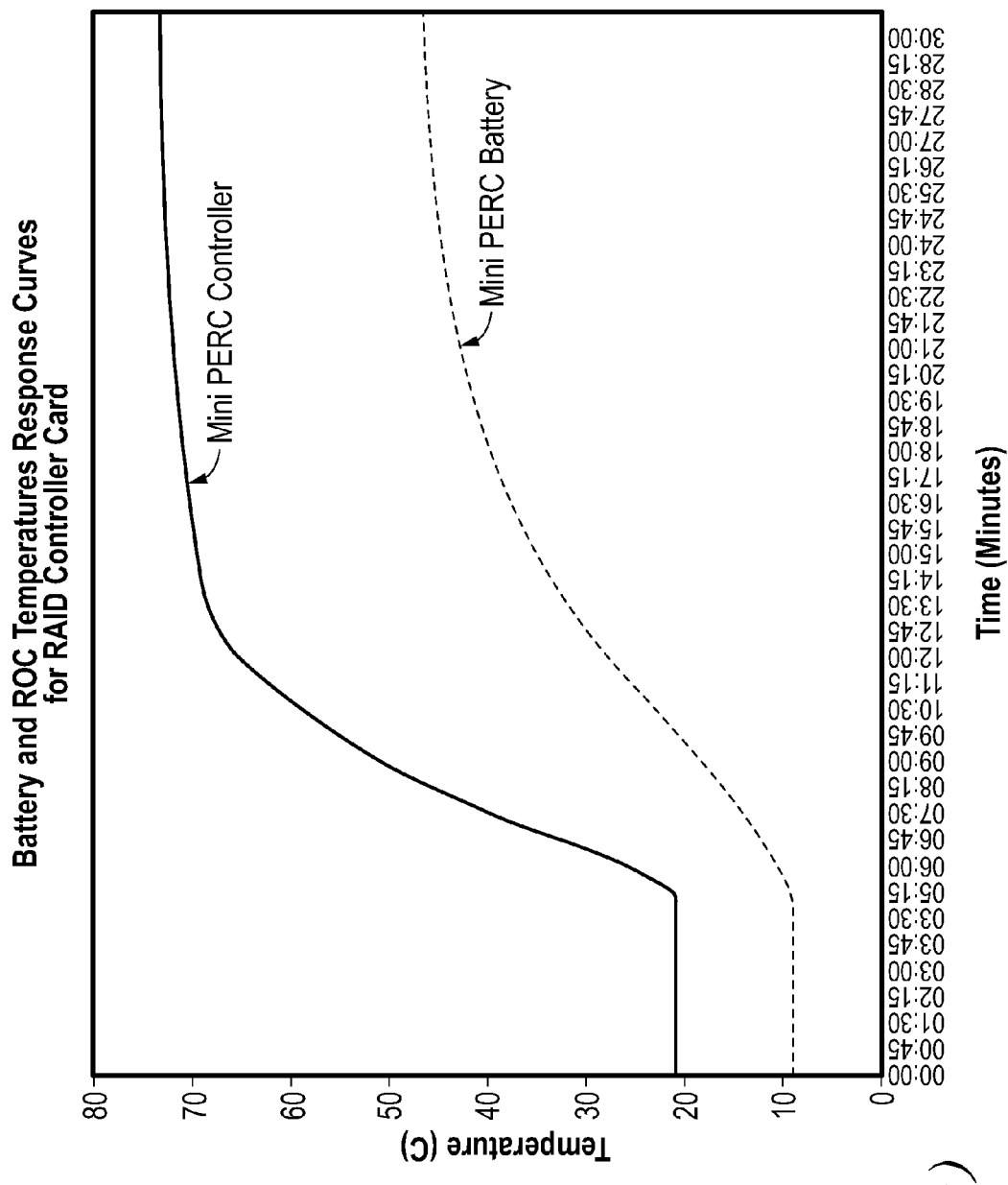
FIG. 2 illustrates temperature increase versus time for battery and controller components of a RAID controller card.
Figure 3:
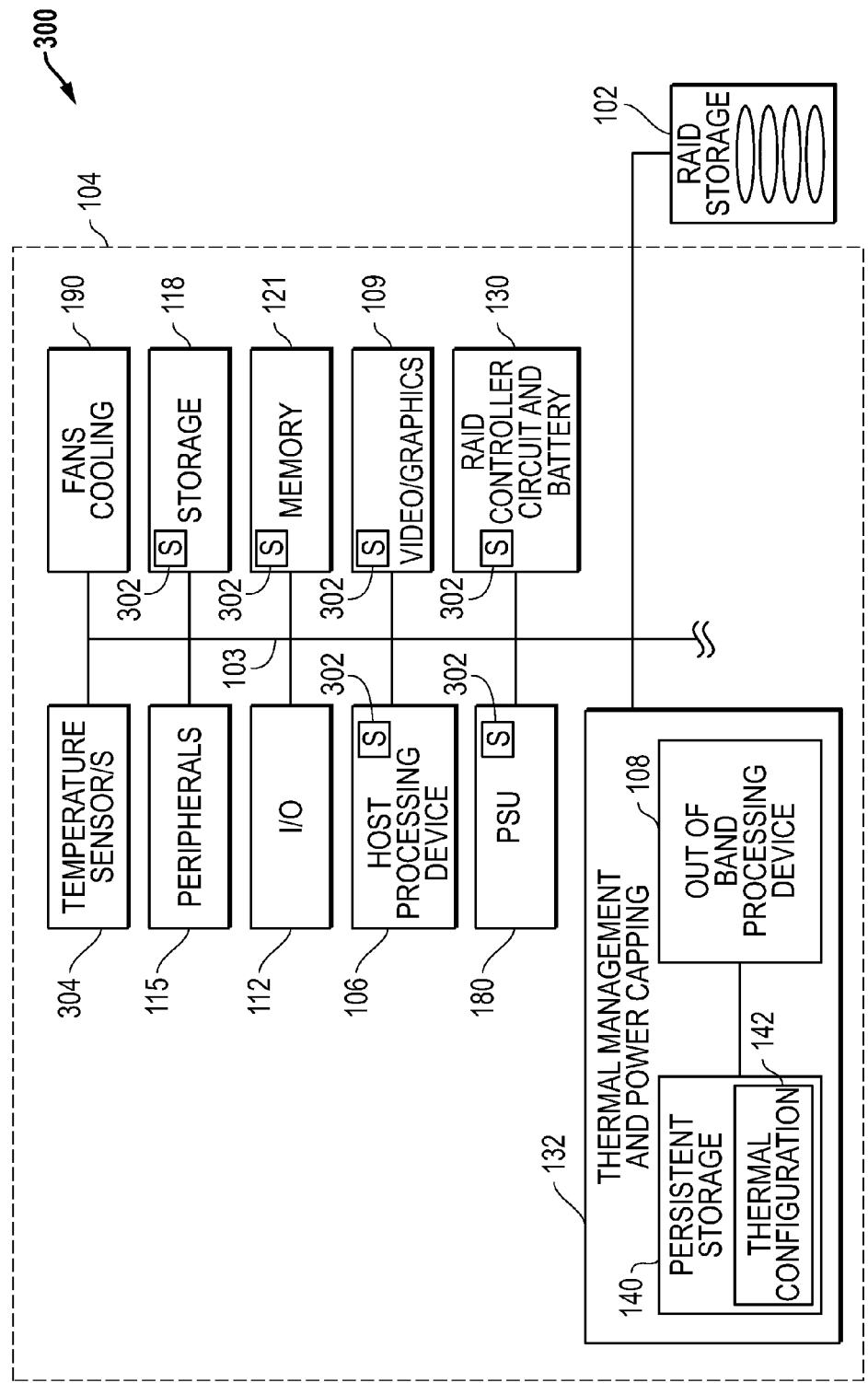
FIG. 3 illustrates a simplified block diagram of an information handling system configured according to one exemplary embodiment of the disclosed systems and methods.

FIG. 3 illustrates one exemplary embodiment of an information handling system 300, configured in this embodiment as a RAID system server coupled to RAID storage memory 102. RAID storage memory 102 includes an array of individual storage hard disk drives (RAID array) functioning as a single storage unit to which data is written by RAID system server 300. RAID system server 300 writes data to RAID storage memory 102 in a manner such that data is distributed across the multiple storage drives. Information stored on each disk drive of RAID storage memory may be duplicated on other disks in the array, e.g., to create redundancy so that no data is lost if disk failure occurs. It will be understood that RAID system 300 illustrated in FIG. 1 is exemplary only, and that the disclosed thermal control systems and methods may be implemented with any other (e.g., non-RAID) information handling system embodiments that include one or more heat-producing electrical components and one or more cooling fans. Such components may be contained within an enclosure 104 (e.g., such as a 2U, 3U, 4U, etc. computer chassis) and cooled by one or more cooling fan/s in a manner as described below.

Still referring to FIG. 3, system 300 may include one or more in-band host processing devices 106 (e.g., CPU executing host operating system), video/graphics hardware (e.g., video card/s) 109, storage (e.g., one or more HDDs) 118, memory (e.g., RAM) 121, input/output (I/O) 112, peripherals 115, system power supply PSU 180, and RAID controller circuit 130 (e.g., RAID card such as PowerEdge RAID Controller (PERC) card available from Dell, Inc). RAID controller circuit 130 is present for controlling transfer of data to and from RAID storage 102. As shown, one or more buses or other suitable communication media 103 may be provided for allowing communication of data and other information between the various components of system 300. Also shown present in FIG. 3 are one or more cooling fans 190 configured for cooling components of system 300, and out-of-band processing device 108 (e.g., (e.g., based board management controller, service processor, embedded processor, remote access controller, etc.) coupled to persistent storage 140. In one embodiment, multiple cooling fans may be employed to cool different zones of a chassis 104, e.g., such as a first set of one or more fans positioned and assigned to cool the front disk drives 118 of a system 300 and a second set of one or more fans positioned and assigned to cool the rear disk drives 118 off a system 300. Together, out of band processing device 108 and persistent storage 140 may be configured to implement thermal management and power capping 132 based on one or more real time measured hardware component temperatures.

It will be understood that although one particular exemplary embodiment of an out-of-band processing device 108 is illustrated in FIG. 3, the disclosed systems and methods may be implemented in other embodiments using any other type and/or combination of out-of-band processing devices and/or in-band processing devices (e.g., such as host processing device 106) that is suitable for implementing one or more features of the disclosed systems and methods as described herein. It will also be understood that an out-of-band processing device is a processing device separate and independent from any in-band host central processing unit (CPU) such as host processing device 106 that runs the host OS of an information handling system 300, and without management of any application executing with a host OS on the host CPU.

As further shown in FIG. 3, one or more heat producing components of an information handling system 300 may be provided with a respective thermal sensor 302 that is configured to sense the real time temperature of its corresponding hardware component and then to report this sensed temperature to out of band processing device 108 across communication media 103, e.g., at predetermined time intervals that may be unique for each component. One or more chassis temperature sensors 304 may also be provided as shown for monitoring internal chassis temperatures at one or more different chassis locations, e.g., such as ambient temperature at the air inlet of the chassis 104. Non-volatile persistent storage 140 may be coupled to out of band processing device 108, and may contain thermal configuration information 142 that is accessible by out of band processing device 108. As described further herein, out of band processing device 108 may control operation of cooling fan/s 190 based on thermal configuration information 142 and measured temperature information received from sensors 302.

Table 1 below is a configuration table as it may be implemented in one exemplary embodiment as thermal configuration information 142.

In Table 1, the "Sensor/Origin Fan Zone" entry may be employed to specify either a designated temperature sensor/s (e.g., 302 and 304) from which measured temperature is to be used as the basis for cooling fan speed control (or alternatively for power capping) using a specified algorithm and coefficients, or for specifying the identity of a designated origin cooling fan/s 190 having a cooling fan speed upon which to map the cooling fan speed of another different cooling fan/s 190 by using a specified coefficient for a given fan zone. In turn, the cooling fan speed of the designate origin cooling fan may be specified in another configuration entry for control using any other desired combination of temperature sensor and/or origin cooling fan zones, and/or functions as described elsewhere herein. Thus, the speed of a first set of one or more cooling fans 190 may be mapped by a selected function to the speed of a second and different set of one or more cooling fans 190, with the second set of cooling fans 190 being in turn controlled by, for example,

TABLE 1

| Configuration Number | 1 | | | | | | 2 | | | | | |
|---|---|---|---|---|---|---|---|---|---|---|---|---|
| Configuration Name | HDD Offset | | | | | | PERC_Batt_Offset | | | | | |
| Sensor/Origin Fan Zone | HDD_max | | | | | | PERC_Battery | | | | | |
| Controlled Fans | All | | | | | | Fans 3-5 | | | | | |
| Coefficient Labels | a | b | c | d | e | f | a | b | c | D | e | f |
| Zone 1 Coefficients | | | | 0 | 2 | 100 | | | | 0 | 0 | 10 |
| Zone 2 Coefficients | | | | | | | | | | | | |

As illustrated in Table 1, different thermal control configurations may be named and defined for one or more sensor and/or fan zone temperature sensors, in this case HDD component temperature and inlet ambient temperature for an information handling system chassis 104. Such configuration table information may be predefined and loaded upon initial manufacture or configuration of an information handling system. In another embodiment, such a configuration table or other form of thermal configuration information 142 may be editable by a local or remote user in order to dynamically configure (e.g., define and/or change) thermal control characteristics implemented by thermal management 132 of system 300. For example, out of band processing device 108 may be a service processor that executes system BIOS for system 300, and thermal configuration information 142 (e.g., such as Table 1) may be dynamically configurable by a local user of system 300 using system I/O 112, e.g., via particular key combinations or selections of BIOS settings presented by processing device 108 during boot-up of system 300. In another example, thermal configuration information 142 may be editable by a remote user from across a network via a remote access controller (not shown) coupled to out of band processing device 108.

It will be understood that although Table 1 illustrates two different configurations for two corresponding different sensor/origin fan zones, the number of different defined configurations may vary according to the particular application, e.g., the number of defined configurations may be only one or may be greater than two. Moreover, it will be understood that the particular format of Table 1 is exemplary only and is merely illustrative of one of many different ways that thermal control configuration information 142 may be formatted and stored in storage 140 for use by processing device 108.

mapping by a selected function to the speed of a third and different set of one or more cooling fans 190 or controlled using a specified function using the measured temperature of a designated temperature sensor.

Still referring to the exemplary configuration of Table 1, it may be seen that measured input temperature from a particular temperature sensor may be specified for use with each configuration, in this case HDD component temperature sensor 302 has been specified for use with the number 1 configuration, and RAID controller circuit (PERC) battery temperature sensor 302 has been specified for use with the number 2 configuration. Additionally, the identity of cooling fans to be controlled by each configuration may also be selected, in this case all (five or more) cooling fans of system 300 have been selected for control by the number 1 configuration and only three cooling fans 3-5 of system 300 have been selected for control by other (number 2) configuration. However, it will be understood that a given configuration may be assigned to control any cooling fan or combination of multiple cooling fans (or alternatively power capping levels) to fit a given application. Moreover, it will be understand that a local or remote user may be given the ability to enter changes in the configuration table in order to effect designated changes in thermal control operation.

Still referring to Table 1, coefficient values may be designated as applicable for the given type of algorithm designated for a given configuration, e.g., five coefficients for a $4^{th}$ order polynomial (including constant), two coefficients for a first order polynomial, two coefficients for a first order polynomial, etc. In Table 1, provision is made for entering up to six different coefficients (e.g., a, b, c, d, e and f), although provision for selection of fewer or additional numbers of coefficients may be provided. In one exemplary embodiment, configuration tables such as illustrated in Table 1, may be editable as thermal configuration information 142 via I/O hardware 112 and graphical user interface (GUI) displayed by video/graphics 109 of system 300, or otherwise by displaying a GUI to a remote user and accepting configuration details from the remote user over a network.

In one exemplary embodiment, an automatically generated system inventory may be provided (e.g., by BIOS or other suitable source) to out of band processing device 108 (e.g., service processor) and/or a remote access controller (e.g., iDRAC), where the system inventory may be compared against configuration entries in a configuration table of thermal configuration information 142 to determine matched configurations for use in thermal control. For each matched configuration the defined algorithm may be calculated using a defined temperature sensor. The sensor may be chosen from a predefined list of sensors.

It will be understood that the information in Table 1 is exemplary only, and that any number and/or variety of different configuration parameters and other information may be specified for any number of other different configurations and combinations of components that is suitable for a given application.

Figure 4:
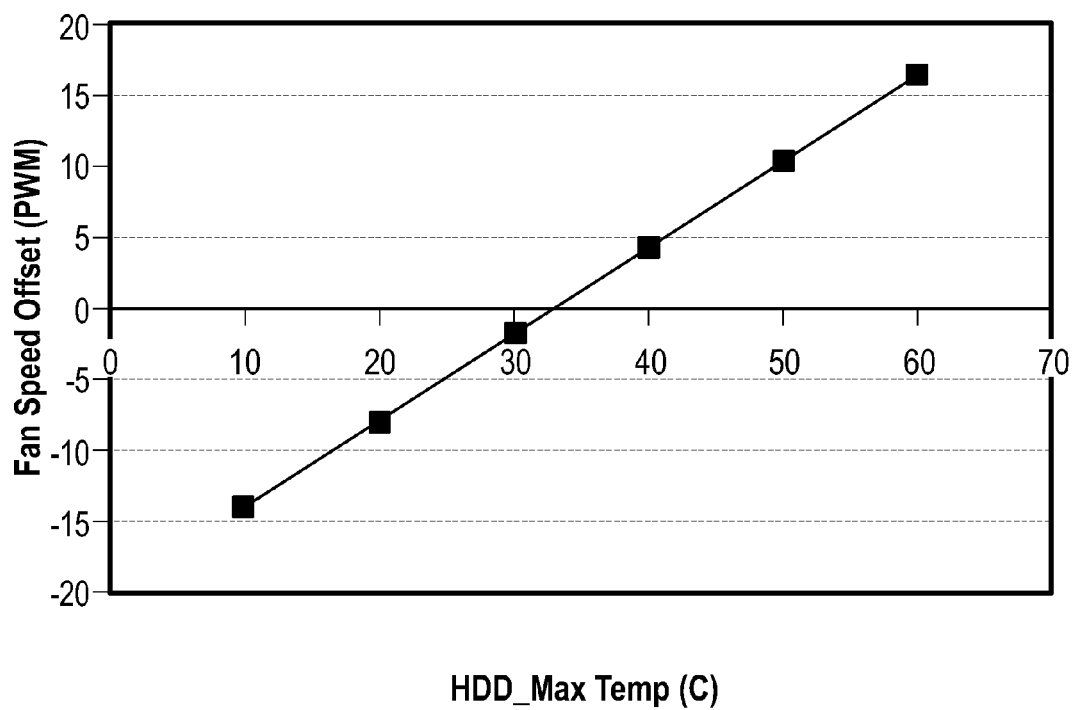
FIG. 4 illustrates a temperature versus pulse-width modulation (PWM) functional relationship according to one exemplary embodiment of the disclosed systems and methods.

FIG. 4 illustrates one exemplary embodiment of a temperature versus fan speed functional relationship that may be selected for controlling cooling fan speed based on measured HDD temperature as designated in Table 1 herein. Such a thermal control configuration may be selected, for example, by designating an internal HDD temperature sensor as the temperature source together with a polynomial for the thermal control relationship, e.g., by inputting this information into a configuration table such as Table 1 that is maintained as thermal configuration information 142 in persistent storage 140. In the particular embodiment of FIG. 4, the HDD/cooling fan speed relationship is defined by a polynomial equation which defines the resulting pulse width modulation (PWM) control signal based on measured HDD temperature, i.e., y is the resulting pulse width modulation (PWM) control signal based on measured HDD temperature, x. The resulting PWM control signal may be used to control the cooling fan speed. Besides PWM, it will be understood that any other suitable type of control signal may be employed to control cooling fan speed and/or power capping operations.

Using the illustrated functional relationship of FIG. 4, negative values of PWM will be calculated at measured HDD temperatures of less than about 33° C., in which case the calculated PWM values will be ignored to result in a control signal having a value of 0 such that an "off" cooling fan speed of zero (or alternatively a baseline minimum cooling fan speed) will be indicated for those cooling fans that are defined to be controlled by the indicated temperature sensor or origin fan zone that is defined relationship of FIG. 4. This allows temperature control relationships, such as FIG. 4, to be defined close to the specification of the components in a such a way that lower measured component temperatures within the operating temperature range of a given component may result in negative PWM numbers (thus resulting in no cooling or no additional cooling being required by the thermal control), but at the same time such that increased cooling fan speeds are indicated by the thermal control when the measured temperature of a given hardware component comes close to the specified maximum operating temperature of the given component.

It will be understood that multiple cooling fan relationships may be simultaneously implemented using different thermal control configurations for controlling one or more of the same common cooling fans based on, for example, different temperature sensors and/or origin fan zones. In such a case, cooling fan speed at any given time may be the maximum indicated cooling fan speed indicated by all of the different thermal control configurations at that time. Therefore, even if one thermal control configuration indicates a PWM of 0, the controlled cooling fan speed may nonetheless be greater than zero if one or more other thermal control configurations are simultaneously calling for a cooling fan speed that is greater than zero, e.g., based on input from a different temperature sensor and/or origin fan zone. It will also be understood that a common thermal control configuration (such as the depicted cooling fan speed function of FIG. 4) may be selected for control of all chassis cooling fans or subsets of one or more cooling fans, and/or that measured temperatures of different hardware components (e.g., CPU temperature, etc.) may be selected for input into the function, e.g., by varying the selections of Table 1.

Figure 5:
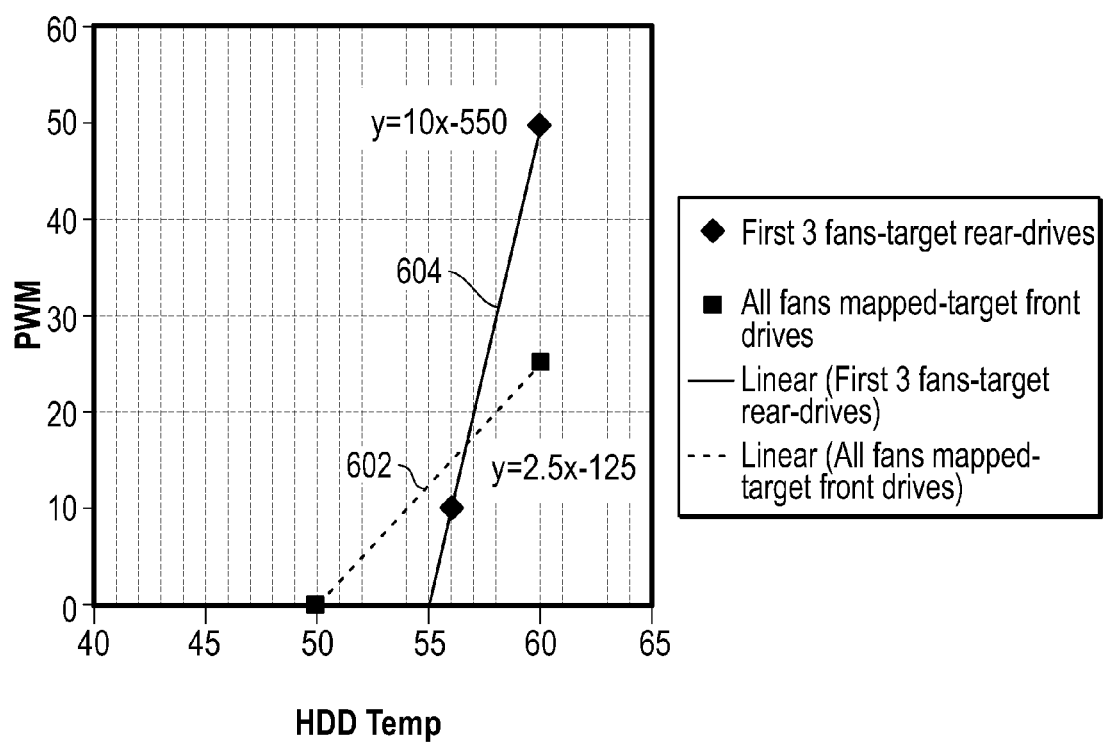
FIG. 5 illustrates a temperature versus pulse-width modulation (PWM) functional relationship according to one exemplary embodiment of the disclosed systems and methods.

FIG. 5 illustrates one exemplary embodiment of how thermal configuration information 142 may be defined (e.g., by user input into a configuration table such as Table 1) to include multiple functions that may be defined with inputs based on the same temperature sensor data, e.g., in order to implement different fan ramp rates for different fans or groups of cooling fans in a common enclosure 104, e.g., so as to cool different zones or different groups of heat-generating components within the chassis 104. For example, a first linear fan speed control function 602 having a lower slope as defined by polynomial y=2.5x−125 may be mapped to control all cooling fans within a common enclosure 104 based on the same temperature measurements from a given HDD temperature sensor. At the same time, a second linear fan speed control function 604 having a higher slope as defined by polynomial y=10x−550 may be mapped to control only a portion of the cooling fans, e.g., based on PERC battery temperature.

Figure 6:
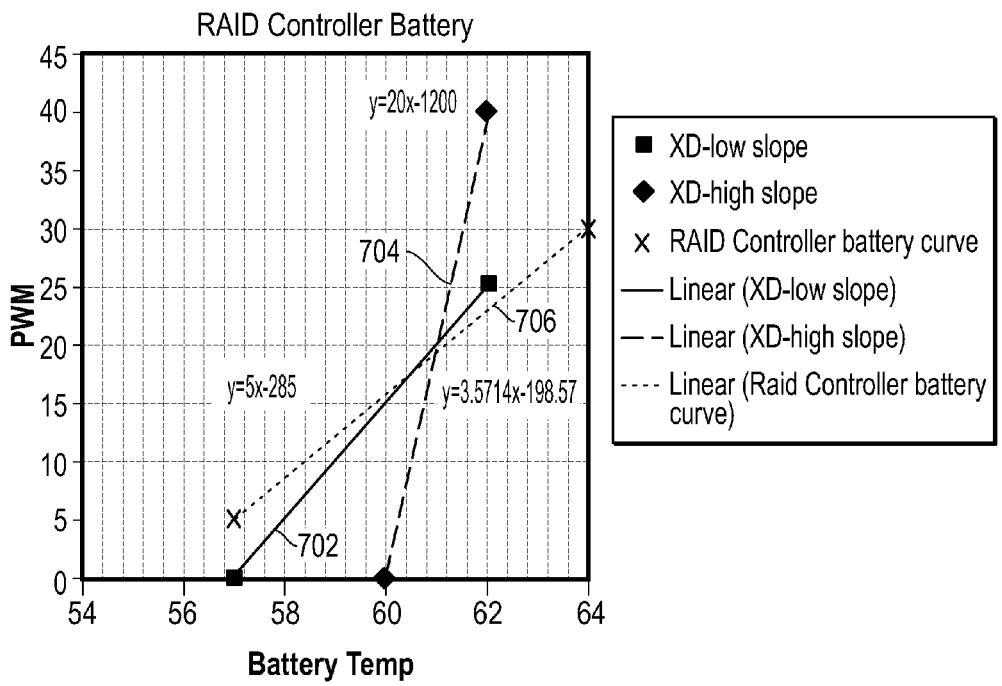
FIG. 6 illustrates a temperature versus pulse-width modulation (PWM) functional relationship according to one exemplary embodiment of the disclosed systems and methods.

FIG. 6 illustrates one exemplary embodiment of how thermal configuration information 142 may be defined to include multiple fan speed control functions that may be defined with inputs based on the same temperature sensor data to enable a slow cooling fan speed increase (lower slope linear function 702) with increasing temperatures at lower temperatures and a faster cooling fan speed increase (higher slope linear function 704) with increasing temperatures at higher temperatures. For example, a first temperature configuration function 702 having a lower slope as defined by polynomial y=5x−285 may be mapped to control one or more cooling fans to cool a raid controller battery based on temperature measurements from the raid controller battery temperature sensor when the measured battery temperature is in a selected lower temperature range that may be varied to fit a given configuration. A second temperature configuration function 704 having a higher slope as defined by polynomial y=20x−1200 may be mapped to control the same one or more cooling fans to cool the raid controller battery based on temperature measurements from the raid controller battery temperature sensor when the measured battery temperature is in a selected higher temperature range (i.e., in a range of temperatures that is greater than the selected lower temperature range and that also may be varied to fit the given configuration. Also shown in FIG. 6 is raid controller battery curve 706.

Figure 7:
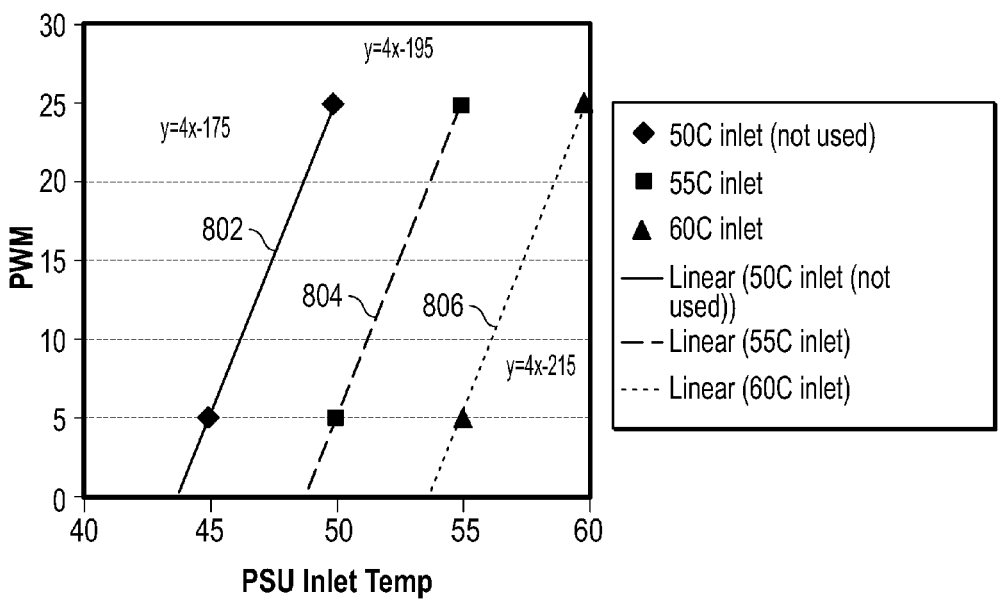
FIG. 7 illustrates a temperature versus pulse-width modulation (PWM) functional relationship according to one exemplary embodiment of the disclosed systems and methods.

FIG. 7 illustrates one exemplary embodiment of a multi-tiered set of cooling fan speed functions 802, 804 and 806 as they may be defined, e.g., for controlling cooling fan speed to fit different cooling needs based on measured inlet power supply unit (PSU) inlet temperature.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. An information handling system, comprising:
   an enclosure;
   one or more heat generating hardware components contained within the enclosure; and
   thermal management circuitry comprising at least one processing device coupled to a non-volatile memory,
     the non-volatile memory including thermal configuration information stored with multiple different predefined combinations of particular heat generating hardware component/s and temperature sensor/s assigned to control power capping for the particular heat generating hardware component/s,
       where each different predefined combination of particular heat generating hardware component/s and temperature sensor/s of the thermal configuration information comprises a defined functional relationship between power capping level and sensed temperature of particular heat generating hardware component/s, where the sensed temperature is feed back to the at least one processing device and
     the at least one processing device being configured to access and select only one of the multiple different predefined combinations of particular heat generating hardware component/s and temperature sensor/s assigned to control power capping for the particular heat generating component/s of the stored thermal configuration information
   and control power capping by selectively limiting power consumption of a heat generating hardware component based on the selected one of the multiple different predefined combinations of particular heat generating hardware component/s and temperature sensor/s assigned to control power capping for the particular heat generating component/s in combination with the sensed temperature of the selected particular heat generating hardware component; and
   the at least one processing device is further configured to control cooling of the one or more heat generating hardware components.

2. The information handling system of claim 1, further comprising:
   at least one cooling fan configured to operate at a variable speed to supply different flow rates of cooling air within the enclosure to cool the one or more heat generating hardware components; and
   where the at least one processing device is configured to access thermal configuration information comprising of one of multiple different predefined combinations of particular cooling fan/s and temperature sensor/s assigned to control the particular cooling fan/s, and
   control the variable speed of the at least one cooling fan to supply the different flow rates of cooling air based on a selection of one of multiple different predefined combinations of particular cooling fan/s and temperature sensor/s assigned to control the particular cooling fan/s in combination with the sensed temperature of the selected particular heat generating hardware component.

3. The information handling system of claim 1, further comprising:
   at least one cooling fan configured to operate at a variable speed to supply different flow rates of cooling air within the enclosure.

4. A method for managing thermal control for an information handling system, comprising:
   providing an information handling system comprising:
     an enclosure;
     one or more heat generating hardware components contained within the enclosure and thermal management circuitry comprising at least one processing device coupled to a non-volatile memory, the non-volatile memory including thermal configuration information stored with multiple different predefined combinations of particular heat generating hardware component/s and temperature sensor/s assigned to control power capping for the particular heat generating component/s,
       where each different predefined combination of temperature sensor/s and heat generating component/s of the thermal configuration information comprises a defined functional relationship between power capping level and sensed temperature of particular heat generating hardware component/s, where the sensed temperature is feed back to the processing device;
   using the at least one processing device to access and select only one of the multiple different predefined combinations of particular heat generating hardware component/s and temperature sensor/s assigned to control power capping for the particular heat generating component/s of the stored thermal configuration information;
   using the at least one processing device to control power capping by selectively limiting power consumption for a heat generating hardware component based on the selected one of the predefined combinations of particular heat generating hardware component/s and temperature sensor/s assigned to control power capping for the particular heat generating component/s of the thermal configuration information in combination with the sensed temperature of the selected particular heat generating hardware component; and further using the at least one processing device to control cooling of the one or more heat generating hardware components.

5. The method of claim 4, further comprises using at least one cooling fan disposed within the enclosure in a position to cool the one or more of the heat generating hardware components; and using the at least one processing device to access stored thermal configuration information comprising of one of multiple different predefined combinations of particular cooling fan/s and temperature sensor/s assigned to control the particular cooling fan/s and control speed of the at least one cooling fan based on a selection of one of the multiple different predefined combinations of particular cooling fan/s and temperature sensor/s assigned to control the particular cooling fan/s in combination with the sensed temperature of the selected particular heat generating hardware component.

6. The method of claim 4, further comprises using at least one cooling fan disposed within the enclosure in a position to cool the one or more of the heat generating hardware components.

* * * * *